(12) United States Patent
Ugge et al.

(10) Patent No.: US 6,252,256 B1
(45) Date of Patent: Jun. 26, 2001

(54) OVERVOLTAGE PROTECTION CIRCUIT

(75) Inventors: Angelo Ugge, Plano, TX (US); Robert Pezzani, Vouvray (FR)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 08/161,878

(22) Filed: Dec. 2, 1993

(30) Foreign Application Priority Data

Dec. 4, 1992 (FR) .................................................. 92 14793

(51) Int. Cl.[7] .................................................. H01L 29/78
(52) U.S. Cl. ........................ 257/111; 257/109; 257/177
(58) Field of Search .................................... 257/109, 111; 361/56, 57, 100

(56) References Cited

U.S. PATENT DOCUMENTS

| | | |
|---|---|---|
| 4,282,555 | 8/1981 | Svedberg . |
| 4,396,932 * | 8/1983 | Alonas et al. .................... 257/110 |
| 4,905,119 | 2/1990 | Webb . |
| 5,220,197 * | 6/1993 | Schovanec ........................ 257/177 |
| 5,352,905 * | 10/1994 | Ohta ................................. 257/110 |

FOREIGN PATENT DOCUMENTS

| | | |
|---|---|---|
| 0 472 405 A2 | 2/1992 | (EP) . |
| 2 453 522 | 10/1980 | (FR) . |
| 2 184884 | 7/1987 | (GB) . |
| WO 87/06768 | 11/1987 | (WO) . |

* cited by examiner

Primary Examiner—Stephen D. Meier
(74) Attorney, Agent, or Firm—Theodore E. Galanthay; Lisa K. Jorgenson; Daniel E. Venglarik

(57) ABSTRACT

A design for an overvoltage protection circuit can be used to fabricate several different circuits incorporating different protection techniques. The design is suitable for use in a single device, which can be easily and inexpensively packaged and protected from the environment. Three terminal protection circuits can have three terminals on an upper surface of a substrate, or one terminal on a lower surface of the substrate, using a single modular design. Additional circuitry can be included to sense for high current conditions which are caused by overvoltages too low to trigger the normal overvoltage protection circuits.

5 Claims, 7 Drawing Sheets

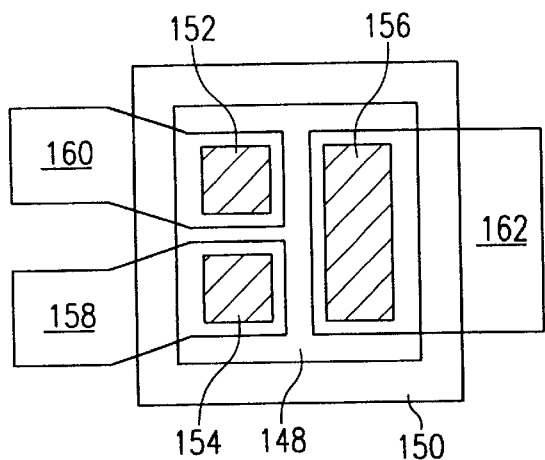
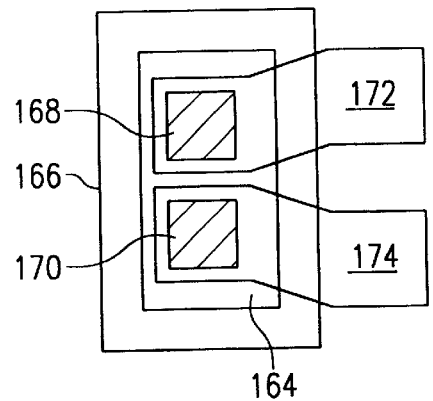
FIG. 11A
FIG. 11B
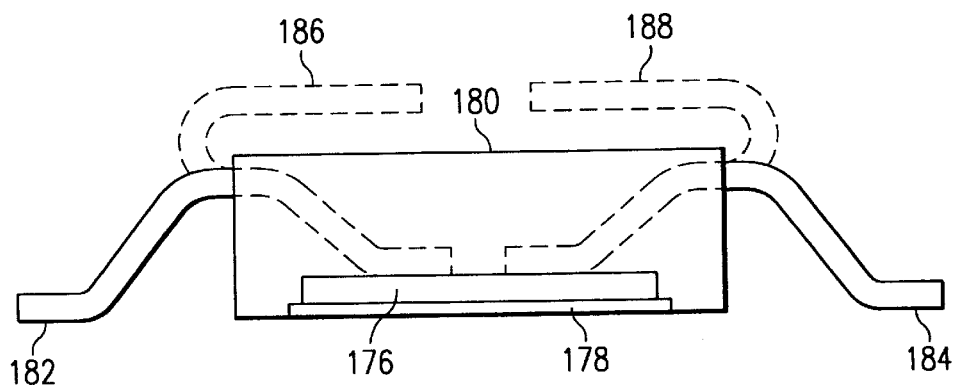
FIG. 12
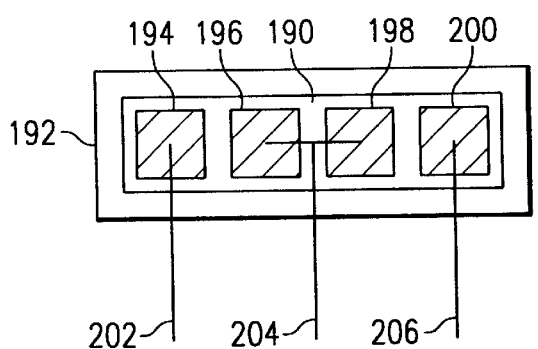
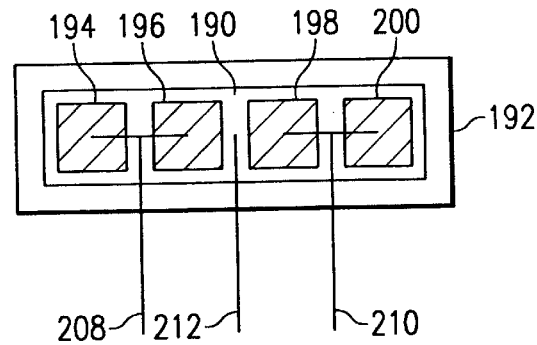
FIG. 13A
FIG. 13B

OVERVOLTAGE PROTECTION CIRCUIT

BACKGROUND OF THE INVENTION

1. Field of the Invention

The present invention relates generally to protective circuits for electronic devices, and more specifically to overvoltage protection circuits suitable for use in protecting devices attached to telephone lines.

2. Description of the Prior Art

In order to prevent damage from electrical overvoltages, devices attached to electrical lines such as telephone lines are protected by overvoltage protection circuitry designed to accomplish this task. Such overvoltages can be caused by, for example, lightning strikes somewhere in the system, or power surges caused by accidental cross connection with power lines. The overvoltage protection circuitry should protect the primary devices, and reset to allow normal operation after the overvoltage condition has passed.

In the past, numerous different circuit designs have been used to provide protection. Typically, such designs utilize 2 or three discrete semiconductor devices packaged into a single component package. These devices can provide good protection, but the use of more than one semiconductor die in a package results in a relatively expensive protection circuit.

Overvoltage protection circuitry intended for use with telephone equipment must take into account the particular hazards which are encountered when devices are connected to the telephone system. Two incoming signal lines, called "tip" and "ring" for historical reasons, carry the normal telephone signal. Overvoltages can occur between these two lines. More commonly, overvoltages can occur between one or both of these lines and ground. In normal operation, the voltage on the tip and ring lines float with respect to ground, although one line is typically at approximately −2 volts, and the other at approximately −50 volts. A 48 volt differential between the two lines is expected in normal operation.

In order to provide the most complete protection, overvoltage potentials must be protected against between the tip and ring lines as well as between these lines and ground. Thus, in most applications a three-way balanced protective circuit is preferred, although two-way balanced circuits are useful and common as known in the art. Examples of devices which have been utilized in the past to provide the required protection can be found in U.S. Pat. No. 4,282,555, titled OVERVOLTAGE PROTECTION MEANS FOR PROTECTING LOW POWER SEMICONDUCTOR COMPONENTS, and U.S. Pat. No. 4,905,119, titled SOLID STATE OVERVOLTAGE PROTECTION CIRCUIT.

Although the circuits described in these patents can provide adequate protection for devices attached to telephone lines, they are difficult to produce inexpensively in a monolithic integrated circuit. The circuit in U.S. Pat. No. 4,905,119 utilizes more than one chip, which increases cost of the overall circuit. The device described in the U.S. Pat. No. 4,282,555 patent can be implemented on a single chip, but P-type diffusions through the depth of the device must be used for isolation. This process adds greatly to the cost of the device.

An object of the invention is to provide a design for an overvoltage protection circuit which can be easily and inexpensively integrated into a single monolithic device.

Another object of the invention is to provide such a circuit that is suitably turned off after an overvoltage in use of a connection with a telephone line.

Another object of the invention is to provide such a circuit that is triggered not only further to an overvoltage, but also further to an overcurrent.

Another object of the invention is to provide such a design which is flexible enough to be easily changed to provide several different protection techniques.

Another object of the invention is to provide such a design to incorporating packaging designs which are flexible and easily adapted to a number of different mounting and thermal dissipation requirements.

SUMMARY OF THE INVENTION

Therefore, in accordance with the present invention, a design for an overvoltage protection circuit can be used to fabricate several different circuits incorporating different protection techniques. The design is suitable for use in a single device, which can be easily and inexpensively packaged and protected from the environment. Three terminal protection circuits can have three terminals on an upper surface of a substrate, or one terminal on a lower surface of the substrate, using a single modular design. Additional circuitry can be included to sense for high current conditions which are caused by overvoltages too low to trigger the normal overvoltage protection circuits.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 11 and 12 illustrate packaging techniques for overvoltage protection devices in accordance with the present invention; and FIG. 13 illustrates two alternative embodiments of packaging techniques in accordance with the present invention.

DESCRIPTION OF THE PREFERRED EMBODIMENT

The structures described below do not include a process flow for manufacturing integrated circuits. The present invention can be practiced in conjunction with integrated circuit fabrication techniques currently used in the art. The figures representing cross-sections of portions of an integrated circuit during fabrication are not drawn to scale, but instead are drawn so as to illustrate the important features of the invention.

The devices described below are directed to overvoltage protection circuitry suitable for use with equipment which interfaces to a standard telephone line. However, it will be appreciated by those skilled in the art that the devices and techniques described herein may be utilized, with modification in some cases, to interface electronic equipment with other types of electrical lines.

Figure 1A:
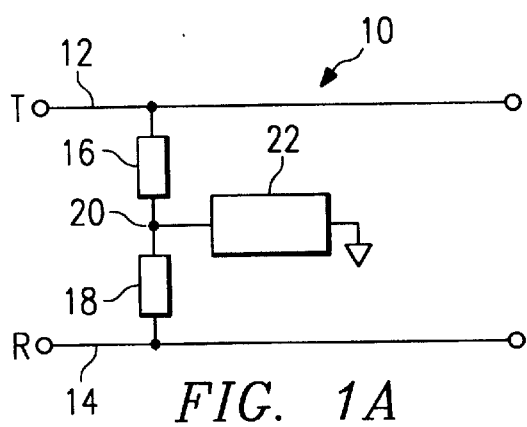
FIGS. 1A, 1B, and 1C contain several schematic diagrams of overvoltage protection circuits.

Referring to FIG. 1, three alternative circuits are shown for protecting electronic equipment from overvoltages on a telephone line. Referring to FIG. 1A, an overvoltage protection circuit 10 is connected to the incoming tip (T) and ring (R) lines 12, 14, respectively. Two surge protectors 16, 18 are connected to the tip and ring lines, respectively, and to a common node 20. A third surge protector 22 is connected between the common node 20 and ground.

As known in the art, the series combination of protectors 16, 18 turn on to short the tip and ring lines 12, 14 when a large voltage differential appears between these lines. If a large voltage potential occurs between the tip and ring lines and ground, all three surge protectors 16, 18, 22 begin conducting and channel current to ground. Additionally, each of the devices 16, 18, 22 has to cease conducting when the overvoltage ceases.

Each of the surge protectors 16, 18, 22 triggers at a voltage which is ½ the desired protection voltage. For example, if it is desired to trigger the protective circuitry for a surge of 500 volts or more, each of the surge protectors 16, 18, 22 will trigger at 250 volts. Thus, if a 500 volt differential appears between the tip and ring lines, surge protectors 16 and 18 will begin conduction. If a 500 or greater potential appears between either the tip or ring line and ground, the appropriate surge protector 16, 18 will be triggered, as well as surge protector 22.

As known in the art, one of the most common causes of high voltage spikes is lightening strikes. Such surges typically cause a large voltage differential between both the tip and ring lines and ground. In such instances, all three of the surge protectors 16, 18, 22 will conduct simultaneously. Since the voltage differential between the tip and ring lines is low compared to the overvoltage contained in the spike, the current conducted by the surge protectors 16, 18 is approximately equal. This requires surge protector 22 to conduct twice the current to ground which must be handled by surge protectors 16, 18. In FIG. 1A, this is indicated by the larger block used for surge protector 22.

Figure 1B:
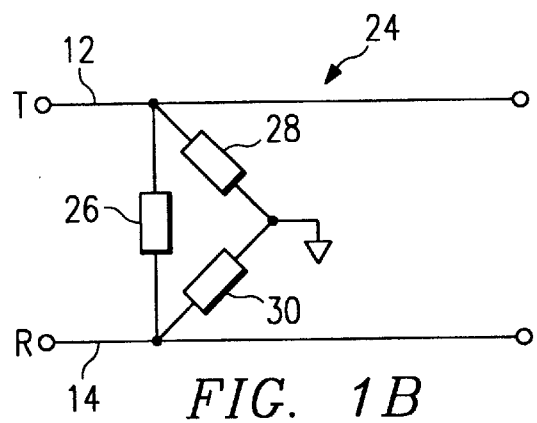

FIG. 1B illustrates an alternative overvoltage protection circuit 24 used with the same tip and ring line 12, 14. This circuit 24 is arranged in a delta connection, as opposed to the star connection of FIG. 1A. Overvoltage protection circuit 24 contains three surge protectors 26, 28, 30. In the delta configuration, each of the surge protectors 26–30 is designed to trigger at the desired protection voltage, as opposed to ½ the desired voltage as described in connection with FIG. 1A. Each leg of the delta arrangement is capable of conducting the same current, although, as described above, the most common high current situations are a high overvoltage on both the tip and ring lines compared to ground. In such a case, both of the surge protectors 28, 30 will conduct approximately the same current to ground.

Figure 1C:
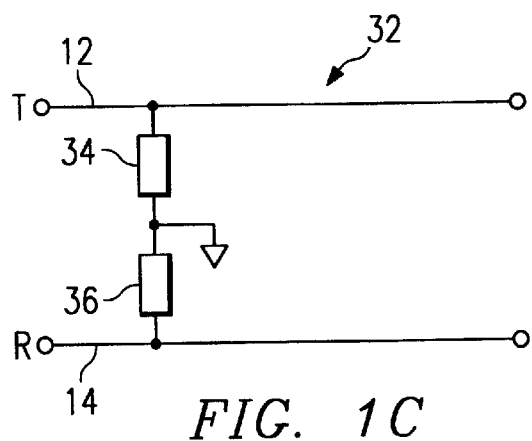

FIG. 1C illustrates a third overvoltage protection circuit 32, which is unbalanced compared with the two circuits previously described. Surge protectors 34, 36 are both connected directly to ground. This circuit provides adequate protection against common mode overvoltages, such as those caused by lightening strikes, but requires an overvoltage twice as large to trigger conduction between the tip and ring lines 12, 14. However, the circuit of FIG. 1C has many uses where the primary mode of protection is expected to be overvoltages to ground, as opposed to those between the tip and ring lines.

Figure 2A:
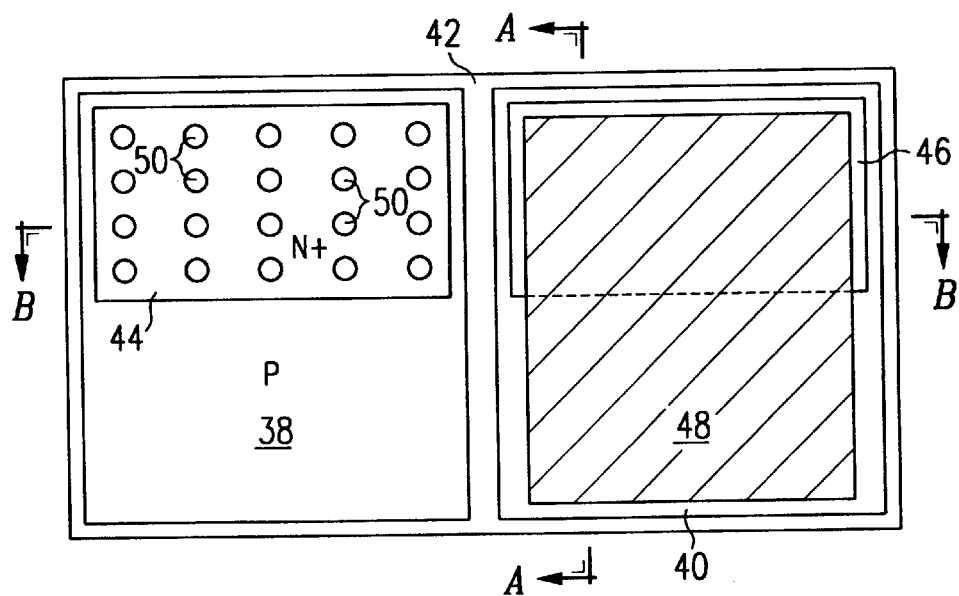
FIGS. 2A, 2B contain top and bottom plan views of a devise constructed in accordance with the present invention.
Figure 2B:
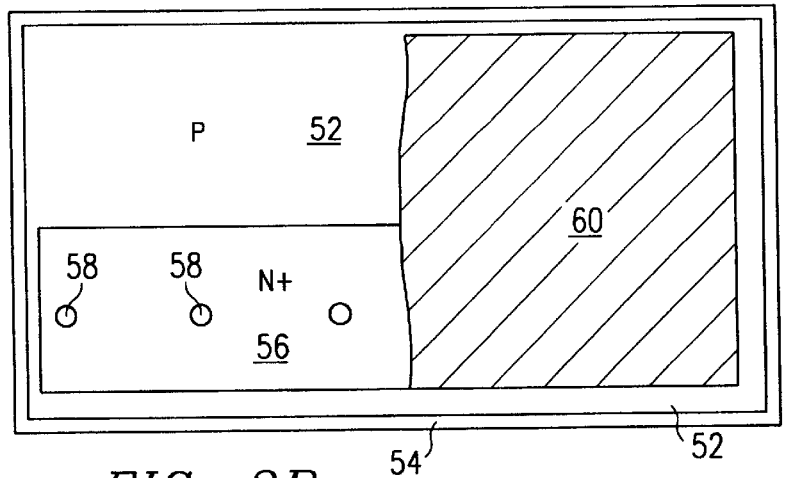

FIGS. 2A and 2B illustrate, respectively, top and bottom views of a monolithic semiconductor device suitable for use as an overvoltage protection circuit. The embodiment shown in FIG. 2 implements the overvoltage protection circuit 24 illustrated in FIG. 1B. Each surge protector shown in FIG. 1B is a bilateral PNPN switch. Referring to FIG. 2A, the protection device includes two P-well regions 38, 40. P-well regions 38, 40 are fabricated on the upper side of a substrate. The upper surface of the substrate is covered by an oxide region 42 over the periphery of the P-wells and between the P-wells. Within each P-well region 38, 40 is a highly doped N+ region 44, 46. A metal contact 48 overlies P-well region 40 and N+ region 46. A similar metal contact is formed over P-well region 38 and N+ region 44, but is removed from FIG. 2A for purposes of illustration.

The N+ regions 44, 46 are patterned so that they are not continuous. Circular regions 50 of the underlying P-well 38 show through the N+ region 44 as shown. These are regions which are blocked from implant of the N+ dopant using masking techniques as known in the art.

Referring to FIG. 2B, a P-well region 52 occupies substantially the entire undersurface of the device, and its peripheral upper surface is covered by an oxide region 54. An N+ region 56 is formed covering approximately ½ of the P-well 52, and contains circular regions 58 which show through to the underlying P-well region 52. The projection of the N+ region 56 is substantially complementary with respect to the N+ regions 44 and 46 of upper surface of the device. A metal contact 60 covers substantially the entire P-well region 52, and is shown broken away in order to expose the silicon surface for the left-hand side of the device.

Figure 3A:
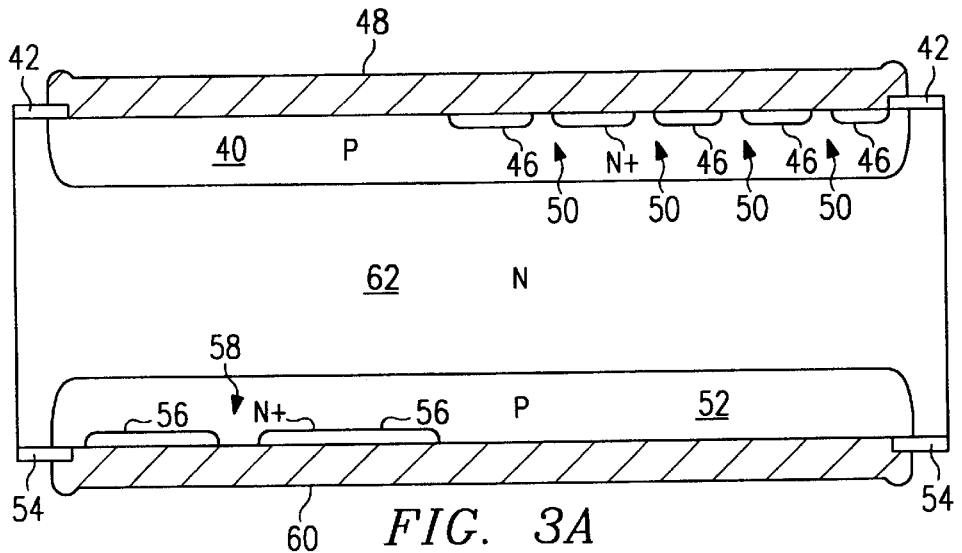
FIG. 3 contains section views of the device of FIG. 2A.

FIG. 3A is a section of the device of FIG. 2A taken along the section line A—A. The P-well and N+ regions are numbered according to FIG. 2A. It can be seen that the P-wells 40, 52 are formed in an N-substrate 62. The peripheral upper surfaces of the P-well regions are passivated at the upper or lower surface of the device by the oxide regions 42, 54.

A bidirectional PNPN switch is apparent from the section view of FIG. 3A. It comprises a first and a second PNPN switch. The first PNPN switch includes the P-well 40, N-substrate 62, P-well 52, and N+ region 56. The second, parallel, PNPN switch is formed by the P-well 52, N-substrate 62, P-well 40, and N+ region 46.

Figure 3B:
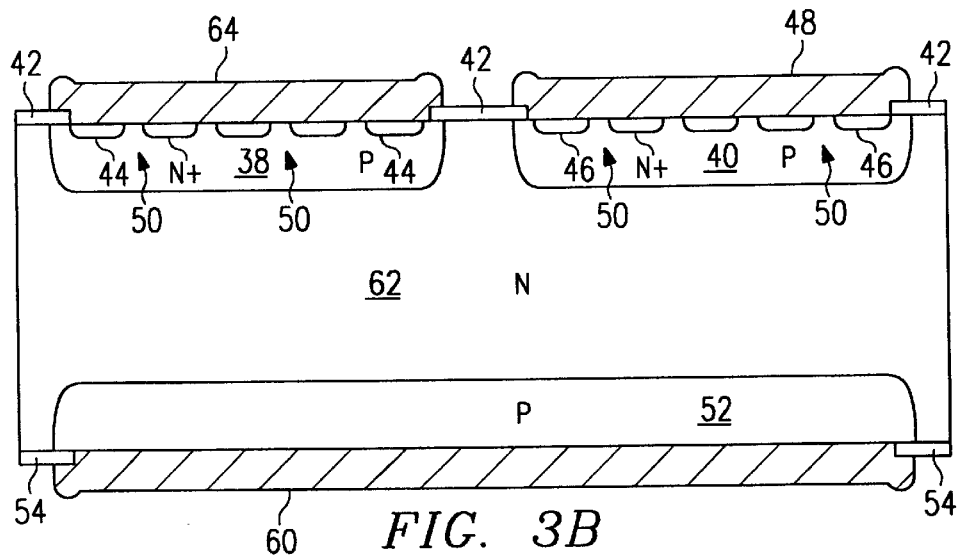

FIG. 3B is a section of the device of FIG. 2A taken along the line B—B. FIG. 3B includes metal contact 64 which was removed from FIG. 2A for ease of illustration.

In addition to the bilateral vertical PNPN switches described in connection with 3A, a bilateral horizontal PNPN switch is formed between contact 64 and contact 48. This bidirectional horizontal switch comprises a first switch consisting of P-well 38, N-substrate 62, P-well 40, and N+ region 46 and a second switch consisting of P-well 40, N-substrate 62, P-well 38, and N+ region 44.

Thus, when a sufficient voltage differential occurs between the tip and ring lines, current flows between contact 64 and contact 48. When an overvoltage occurs between both the tip and ring lines and ground, current flows vertically through the device from contacts 64 and 48 to contact 60, which is connected to ground. The large area of the ground contact 60 ensures that overheating due to current flow will not occur when such large currents flow to ground. Since the currents between tip and ring overvoltages tend to be significantly less, the lesser current handling capacity of the device between contacts 64 and 48 is sufficient.

According to an aspect of the invention, the bilateral PNPN switches which flow vertically through the device to the ground contact 60 are not symmetrical. This is because a larger number of regions 50 show through the N+ regions 44 and 46 to the underlying P-wells 36, 38. A lesser number of P-well show through regions 58 are formed on the back side of the device. The larger number of openings 50 for the top side contacts increases the holding current required to maintain these devices on in the forward direction. The smaller number of openings on the back side, ground, contact defines a smaller holding current, but provides higher surge capacity. In a preferred embodiment, the ratio of number of openings is greater than approximately three-to-one. The ratios can be selected as desired to obtain appropriate ratios for holding current in the two directions.

As is known to those skilled in the art, the protective switches triggered by a positive surge on the tip and/or ring lines (current flowing from line to ground) will switch off by reverse polarity after the disturbance ceases. This reverse polarity is applied by the negative steady bias of the tip and ring lines with respect to ground. However, in the reverse direction, with current flowing from ground towards the tip and ring lines, a larger value for holding current is required. This larger value is required to ensure that the protective device switches off despite the reverse bias of each line with respect to ground. This is to insure that the protective devices switch off to allow normal operation of the line after a voltage surge. Thus, with the asymmetrical switches shown in FIGS. 2 and 3, the device recovers properly regardless of the direction of the surge.

Figure 4:
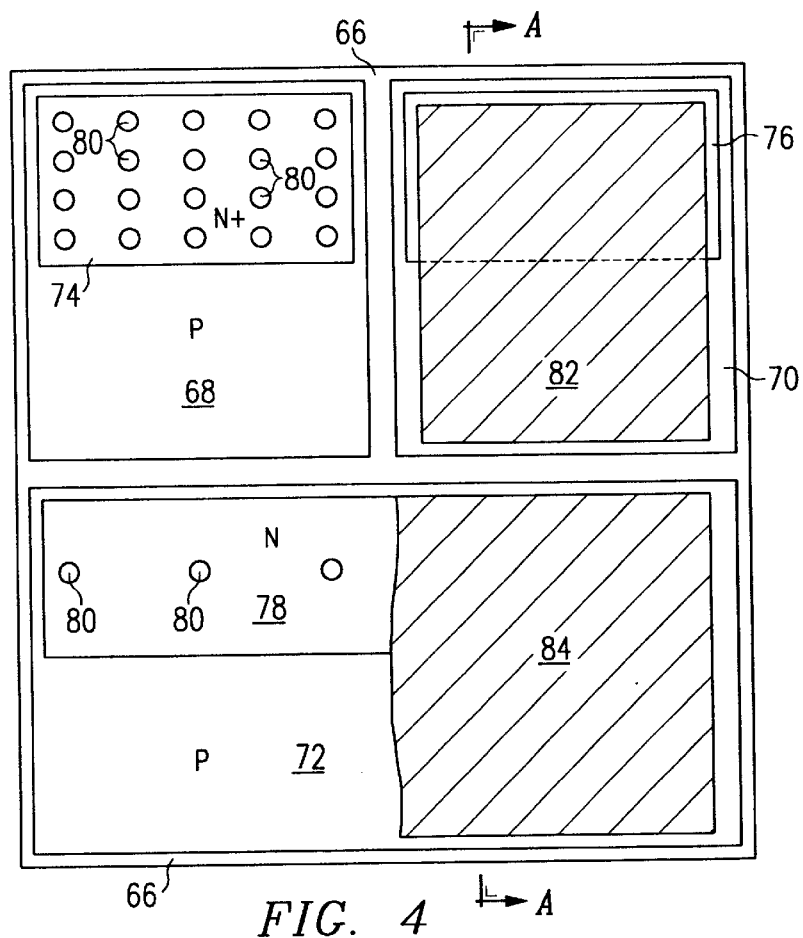
FIG. 4 is an upper plan view of an alternative device constructed in accordance with the present invention.

FIG. 4 illustrates a protective device which implements the star circuit of FIG. 1A. In this device, all three contacts are made on the upper surface of a device. An oxide region 66 surrounds the device and divides it into three regions. Each of these regions contains a P-well 68, 70, 72. P-well 68 contains an N+ region 74, P-well region 70 contains an N+ region 76, and P-well region 72 contains an N+ region 78. The various P-wells show through their respective N+ regions through circular regions 80. Metal contacts 82 and 84 substantially cover their respective P-well regions. As was the case with FIG. 2A, the metal contact over P-well region 68 has been removed, and metal contact 84 has been broken for clarity of illustration.

It will be appreciated that the various regions of the device of FIG. 4 are virtually identical to their counterpart regions shown in FIGS. 2A and 2B. In fact, by rearranging the masks used to form the device, the same device structures can be formed in the device of FIG. 4 as were used in the device of FIG. 2A.

Figure 5:
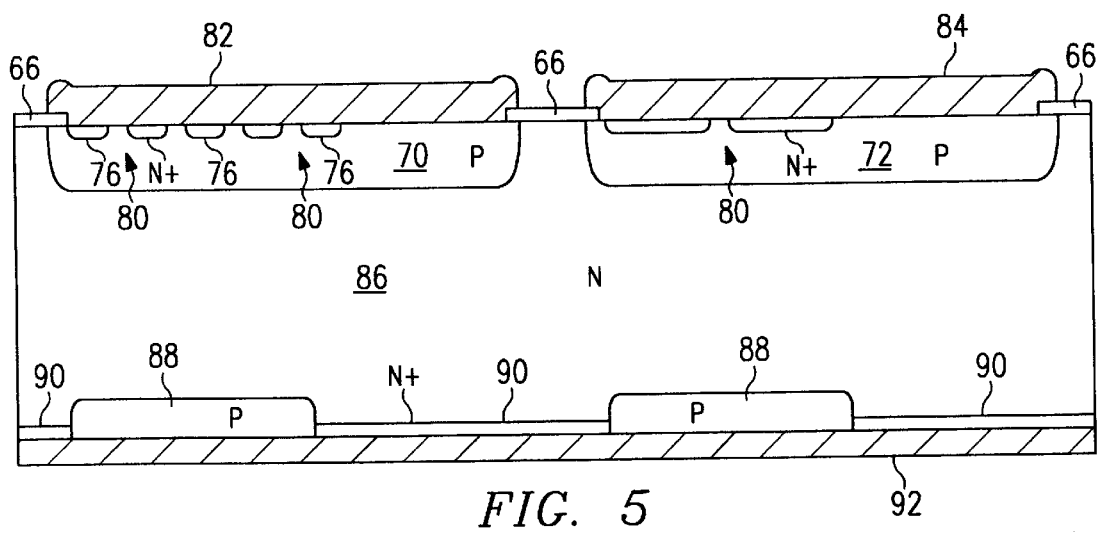
FIG. 5 is a section of the device of FIG. 4.

FIG. 5 is a section view of the device of FIG. 4 taken along section line A—A. The device is formed in an N-substrate 86. P-regions 88 and N+ regions 90 are formed on the back side of the substrate 86, and connected by a back side conductive region 92 on the back surface of the substrate 86. Conductive region 92 may be formed as a metallic contact on the back side of the device, but represents the common node 20 of the star configuration of FIG. 1A. Thus, the conductive region 92 is not normally bonded to a contact external of the device package. The conductive region 92 can be mounted on a heat sink to dissipate heat generated by the device.

The device shown in FIGS. 4 and 5 operates in a manner very similar to that shown in FIGS. 2 and 3. The difference is that current flowing between the tip and ring connections and the ground connection flow vertically to the back side of the device, across the conductive contact region, 92 and vertically up to the other contact. Some lateral current flow will also naturally occur. The primary mode of conduction is through the vertical PNPN switches.

The layout of FIG. 4 provides for a ground contact which has twice the surface area of the tip and ring contacts. This provides for twice the current carrying capacity to the ground contact, which is often required as described above. The placement of the tip and ring contacts adjacent to each other allows for good conductive properties between these two terminals. The tip and ring contacts are symmetrical with respect to the ground contact, so that the properties of both of the bilateral PNPN switches are the same.

The circuits described above provide protection against short, high voltage/high current surges such as lightening strikes. Another type of surge which can occur generates a lower voltage and current, but typically lasts for a longer period of time. This type of problem can be exemplified by a surge which occurs when a sixty cycle power line connects with either the tip or ring line. Although the voltage and current which are generated are lower, such a continuous connection can actually transfer more power than a lightening strike into the equipment connected to the line.

The voltage impressed on the line by such a fault may not be high enough to trigger the PNPN switches of the previously described devices. In order to protect against this lower voltage problem, additional circuitry can be added to the devices previously described.

Figure 6A:
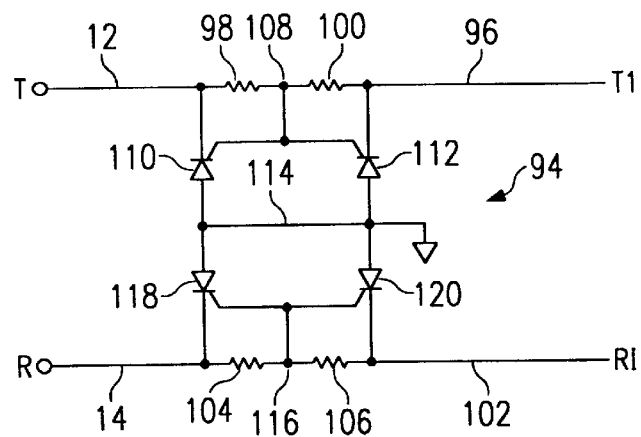
FIG. 6 contains two schematic diagrams of additional preferred embodiments of the present invention.
Figure 6B:
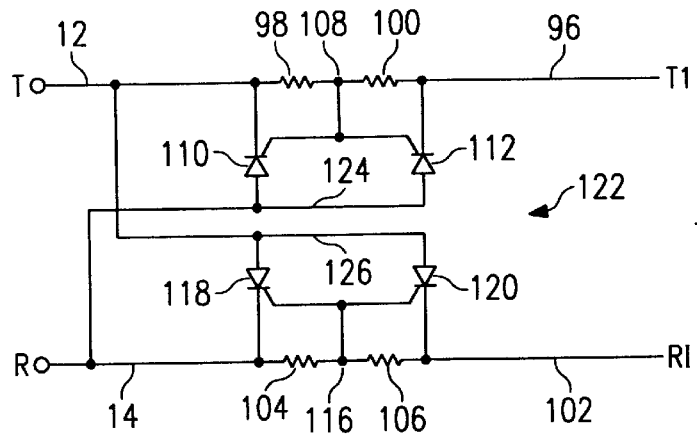

FIGS. 6A and 6B illustrate two alternative circuits which can be connected to the tip and ring lines in addition to the previously described protective circuits.

FIG. 6A illustrates a first embodiment of a surge protect circuit 94. Tip line 12 is connected to T1 line 96 through resistors 98, 100. Similarly, ring line 14 is connected to line R1 102 through resistors 104, 106. The T1 and R1 terminals 96, 102 are connected to the tip and ring inputs of the equipment being protected.

A common node 108 between resistors 98 and 100 is connected to the control gate of thyristor devices 110, 112. The anodes of thyristors 110, 112 are connected to a common node 114, which is grounded. In a similar manner, a common node 116 between resistors 104, 106 is connected to the control gates of thyristor devices 118, 120.

In operation, a voltage drop across the appropriate resistor 98, 100, 104, 106 triggers the associated thyristor. Such a voltage drop is caused by current flowing between the tip or ring lines and the T1 and R1 terminals. For example, current flowing to the left along the tip line causes a voltage drop through resistor 100 which triggers thyristor 112. Current flowing to the right on the tip line causes a voltage drop across resistor 98 which triggers thyristor 110. Current flow in either direction along the ring line similarly triggers thyristor devices 118 or 120.

When a thyristor device is triggered by current flow through its controlling resistor, current is shunted to ground. This prevents current from flowing into, or out of, the protected equipment. Once current flow has ceased, or fallen low enough that the voltage drop across the associated resistor no longer generates a sufficient voltage to trigger the thyristor, the thyristor turns off and the protection circuit returns to its normal state.

Referring to FIG. 6B, surge protect circuit 122 operates in a manner similar to that described in connection with FIG. 6A. Instead of being connected to ground, the anodes of thyristors 110, 112 are connected to common node 124, which is in turn connected to the ring line 14. In a similar manner, the anodes of thyristors 118, 120 are connected to common node 126, which in turn is connected to tip line 12.

Figure 7A:
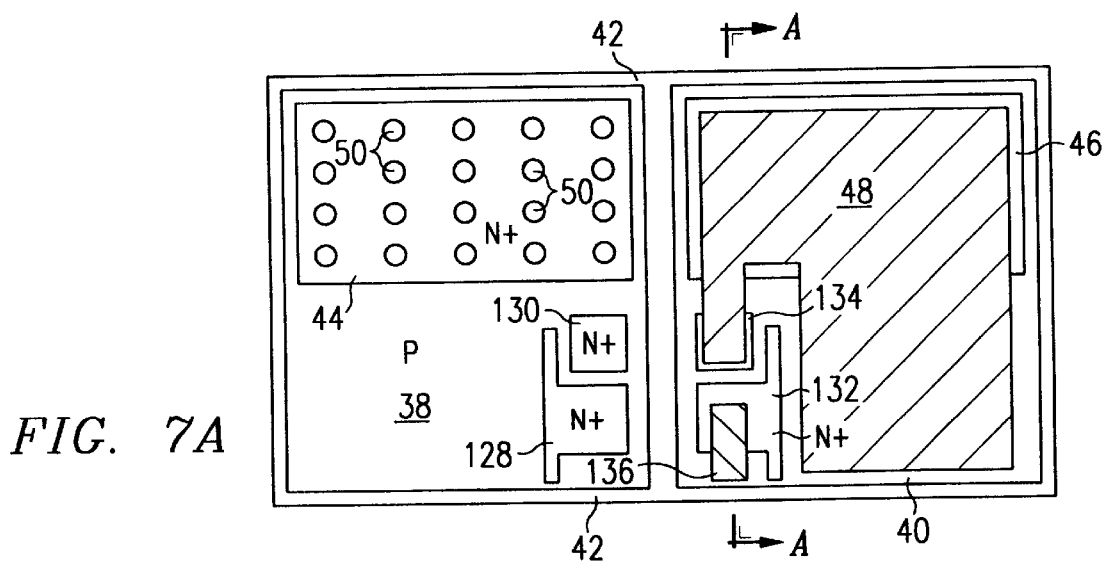
FIGS. 7A and 7B are upper and lower plan views of a device according to FIGS. 2 and 3 incorporating the features of FIGS. 6A and 6B.
Figure 7B:
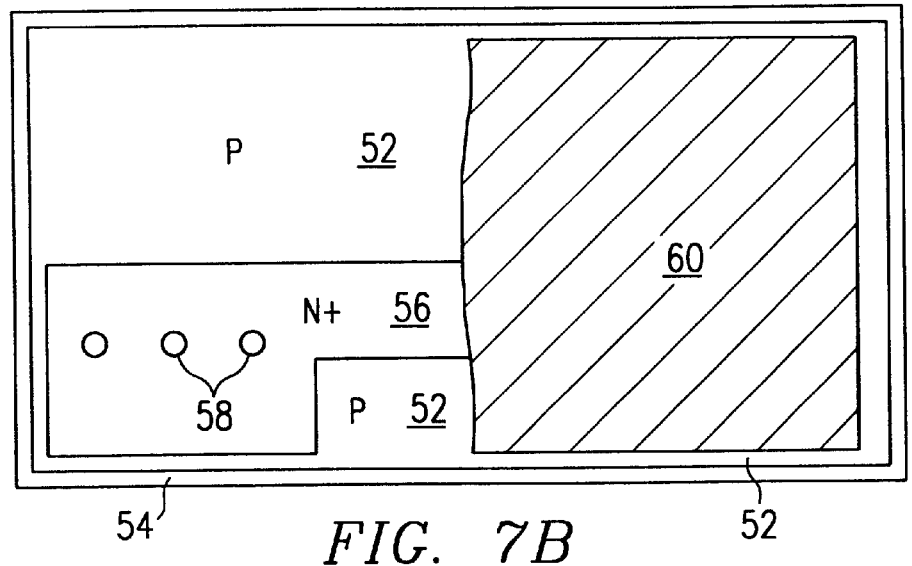

FIGS. 7A and 7B correspond to the device of FIGS. 2A and 2B, with the inclusion of the circuits of FIGS. 6A and 6B. FIG. 7A shows a top plan view of the device, and is similar to the structure shown in FIG. 2A. Additional structures have been formed within the P-wells 38, 40. These structures are N+ regions 128, 130 in P-well 38, and N+ regions 132, 134 in P-well 40.

As shown in FIG. 7A, metal contact 48 is modified so as to contact N+ region 134, and not contact N+ region 132. A separate metal contact 136 makes contact with N+ region 132. Metal contact 48 is used to make a connection to the tip or ring line in the phone system, while metal contact 136 is used to make contact with the tip or ring line which connects to the equipment being protected. As was the case in FIG. 2A, the metal contacts over the P-well 38 have been removed for clarity of description.

FIG. 7B illustrates the back side of the device. As shown, the N+ region 56 is narrowed underneath the thyristor devices.

Figure 8:
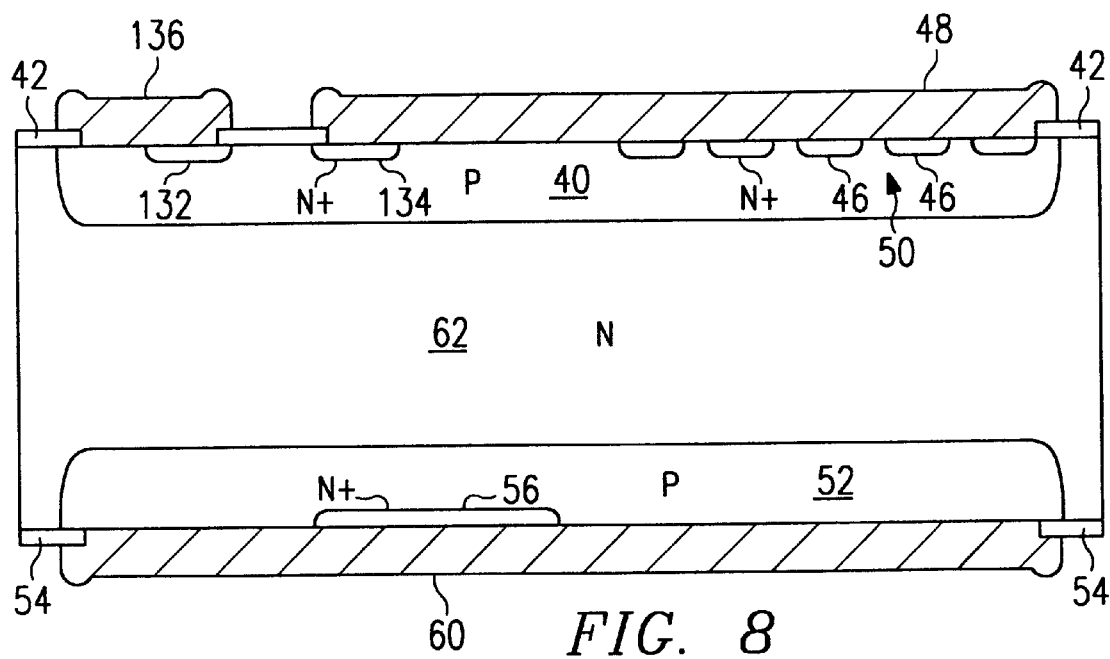
FIG. 8 a section view of the device of FIG. 7.

FIG. 8 is a section view of the device taken through section line A—A of FIG. 7A. FIG. 8 is similar to FIG. 3A with the addition of the thyristor elements 132, 134, 136. The thyristor 110 of FIG. 6A is located between the metalizations 48 and 60. This thyristor is formed from regions 134, 40, 62, and 52. The thyristor 112 of FIG. 6A is located between metalizations 136 and 60. It is formed from the regions 132, 40, 62, and 52. These two thyristors have a common gate defined by the layer 40. The resistors shown in FIGS. 6A and 6B are the current path between metal contact 48, through the P-well 40 underneath N+ regions 132, 134, to the metal contact 136. The P-well region 40 acts as the control gates for the thyristors.

By symmetry, the regions 130, 38, 62, and 52 form the thyristor 118 of FIG. 6A, and the regions 128, 38, 62, and 52 form the thyristor 120 of FIG. 6A. The thyristor 110 shown in FIG. 6B is illustrated in FIG. 7A between the main two top metalizations, of which only metallization 48 is shown. This thyristor is formed by regions 130, 38, 62, and 40, which is a lateral transistor. Thyristor 112 34 of FIG. 6B is formed by the regions 128, 38, 62, and 40. By symmetry, it is possible to recognize in FIG. 7A the thyristors 118 and 120 of FIG. 6B. Thyristor 118 is formed from regions 136, 40, 62, and 38, and thyristor 120 is formed from regions 138, 40, 62, and 38.

Figure 9:
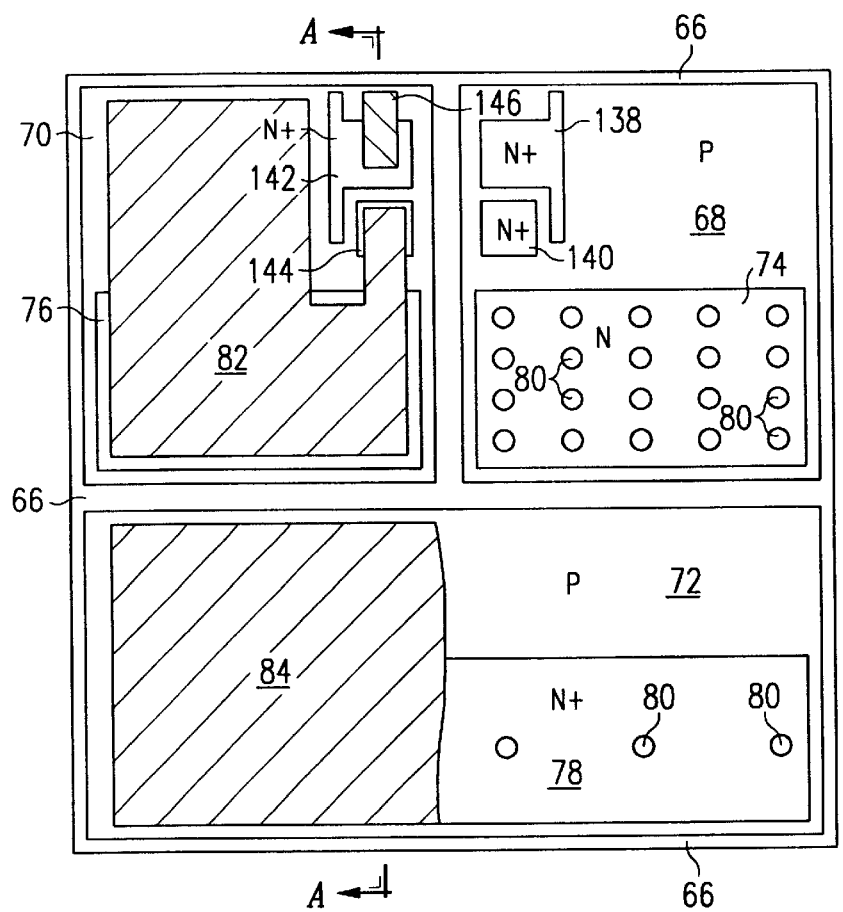
FIG. 9 is an upper plan view of a device constructed in accordance with FIGS. 4 and 5 incorporating the features of FIGS. 6A and 6B

FIG. 9 depicts the star protection circuit of FIG. 4, with the addition of thyristor protection circuits. Due to the different configuration of this device, these thyristors implement the tip to ring connection shown in FIGS. 6A and 6B. The orientation of the various cells has been changed from that shown in FIG. 4, but the bilateral PNPN switches operate as previously described.

Figure 10:
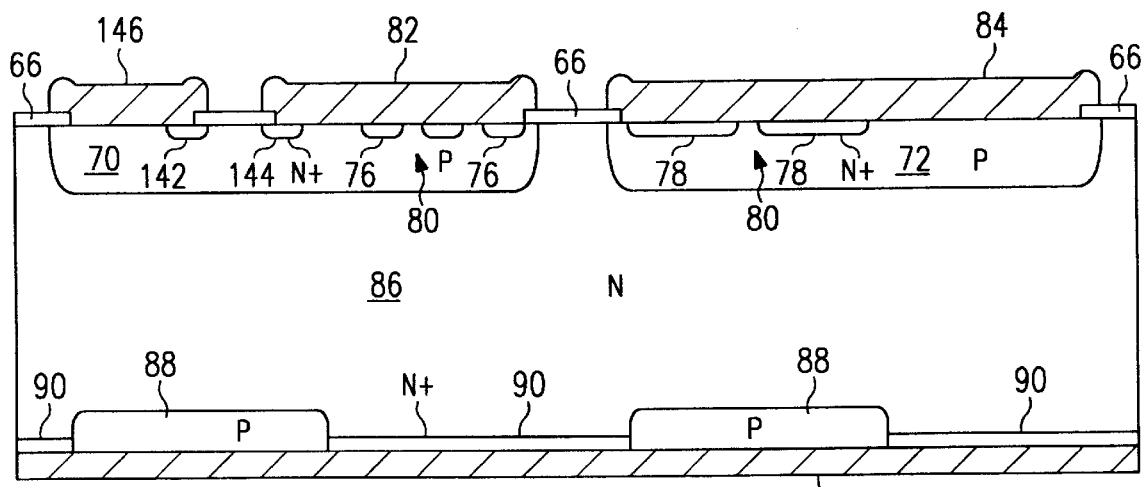
FIG. 10 is a section view of the device of FIG. 9.

N+ regions 138, 140 are formed as shown in P-well region 68. N+ regions 142, 144 are formed as shown in P-well 70. As in the immediately preceding embodiment, metal contact 82 is modified to contact N+ region 144. Metal contact 146 contacts N+ region 142, and is used to connect to the equipment being protected. FIG. 10 is a section view of the device of FIG. 9, taken through section line A—A. It is similar to the device shown in FIG. 5, with the inclusion of the thyristor structures. The resistors shown in FIGS. 6A and 6B are formed by the current path through P-well 70 between metal contact 82 and metal contact 146. As before, the P-well 70 acts as the control gate for the thyristor devices. The P-well 88 underlying the P-well 70 has been enlarged to extend under the thyristor devices as well as under the N+ region 76. In those portions of the P-well not extending under the thyristors, P-well region 88 will extend only under the N+ region 76.

In FIG. 10 the thyristor 110 of FIG. 6A is located between the metalizations 82 and 92. This thyristor is formed by the regions 144, 70, 86, and 88. Thyristor 112 of FIG. 6A is located between metalizations 146 and 92, and is formed by the regions 142, 70, 86, and 88. These two thyristors have a common control gate defined by the layer 70. The resistors shown in FIG. 6B are the current path between metal contact 82 through the p-well 70, underneath N+ regions 142, 144, to the metal contact 146.

In FIG. 9, by symmetry, the thyristor 118 shown in FIG. 6A is formed from regions 140, 68, 86, and 88. Thyristor 120 in FIG. 6A is formed from regions 138, 68, 86, and 88. The contact 92 (FIG. 10) is connected to the ground contact 84 by a diode formed by regions 90, 86, and 72. The thyristors 110, 112, 118, and 120 shown in FIG. 6B are built in FIG. 9 exactly the same way as in FIG. 7A.

The chip designs described above provide numerous advantages related to packaging of the completed devices. They are symmetrical, and several package designs can be used to accommodate the chips containing the protective circuitry.

FIG. 11 shows one preferred bonding technique for the star chip design described in FIG. 4. A semiconductor die 148 is formed according to the structure of FIG. 4. The die 148 is bonded to a heat sink 150, which can be used to carry heat out of the package. Metal contacts 152, 154 are used to connect to the tip and ring lines, and metal contact 156 is connected to ground.

The contacts are bonded to leads 158, 160, 162 using techniques well known in the art. Because all of the necessary circuitry is contained on a monolithic device, only three leads are required.

If the die 148 is a 5-terminal device, as described in connection with FIG. 9, two additional leads can be provided in the lead frame, and bonded to the appropriate locations on the die. Again, this package is simple to construct, and the fact that all required circuitry is contained on a single chip simplifies packaging and insures that a good hermetic seal can be made.

Referring to FIG. 11B, a similar bonding arrangement is illustrated for the device of FIG. 2. Because the ground contact is on the back side of the chip, the surface area of the die 164 is less than that of die 148. In this example, die 164 is bonded to a conductive heat sink 166, which serves to conduct heat away from the device and acts as the ground contact. In a package of this type, the device would be normally attached to a grounded external heat sink. Metal contacts 168, 170 are connected to leads 172, 174, which are in turn connected to the tip and ring lines.

As shown in FIG. 11B, the design having the ground connection on the back side of the device is much smaller, and may have some packaging advantages. However, such design requires that a lead or other conductive connection be made to the back side of the device, and requires that, if a heat sink is connected to the device, that the heat sink be grounded. As an alternative to the technique shown in FIG. 11B, a ground contact can be connected to the back side of the device, and extend to the right as do leads 172, 174.

FIG. 12 illustrates one technique for placing devices of the type described into a hermetically sealed package. The semiconductor die 176 is attached to a heat sink 178. If the delta configuration is being packaged, the heat sink 178 will be suitable for connection to a grounded structure.

A package 180 made of injection molded plastic, or other suitable material, surrounds the die 176 and heat sink 178. Leads 182, 184 may be attached so as to project out both sides of the package 180, or may project from only a single side as shown in FIG. 11B. From the point at which they project from the package 180, the leads may remain horizontal (not shown), or may curve down to make contact at a location which is coplaner with the bottom of the heat sink 178. Alternatively, as shown in phantom 186, 188, the leads may be curved to form a J-lead package as shown.

One advantage to the star structure illustrated in FIG. 4 is that it may be easily reconfigured to operate as an unbalanced protection circuit as shown in FIG. 1C. This may be done as a packaging option, without changing the actual layout of the chip. This is done by modifying the lead arrangement of FIG. 11A to have a single wide lead projecting to the left, in an identical manner to lead 162 which projects to the right. The combined lead 158, 160, and the lead 162 can then be connected to the tip and ring lines of the circuit. The common terminal on the back side of the device is bonded to a conductive heat sink 178 as shown in FIG. 12. This conductive heat sink is, in turn, connected to a grounded heat sink, or otherwise connected to ground potential. Thus, the star configuration device can be converted to an unbalanced configuration device using the same die.

FIGS. 13A and 13B illustrate another layout technique for the device which enables different protective designs to be realized using bonding options. In FIG. 13A, a semiconductor die 190 is bonded to a heat sink 192. The semiconductor die 190 contains four regions 194, 196, 198, 200 which may be identical. Each of the regions 194–200 can be laid out the same as one of the P-well regions contained on the upper side of the chip design of FIG. 2. These four regions are separated by oxide regions, and each has a metal contact on the top.

In order to form a star arrangement, three leads 202, 204, 206 can be bonded to the die 190 as shown. Lead 202 is bonded to region 194, and lead 206 is bond ed to region 200. Lead 204 is bonded to both regions 196, 198, and is preferably a wider lead in much the manner of the lead shown in FIG. 11A. Lead 204 is then suitable for connection to ground, while leads 202 and 206 are connected to the tip and ring lines.

FIG. 13B illustrates a bonding arrangement for the same die 190 which gives a delta configuration. In this bonding technique, leads 208 and 210 are each connected to two of the regions 194–200. The heat sink 190 is conductive, and lead 212 is connected to this heat sink. This results in the unbalanced arrangement shown in FIG. 1C.

As will be appreciated by those skilled in the art, the chip designs and packaging arrangements set forth above provide a single, monolithic device which is capable of performing overvoltage protection for devices such as those attached to telephone lines. Since these designs utilize a single semiconductor device, they may be inexpensively packaged and still be adequately protected against harsh environmental conditions. A number of different package designs can be used with a single integrated circuit design.

While the invention has been particularly shown and described with reference to a preferred embodiment, it will be understood by those skilled in the art that various changes in form and detail may be made therein without departing from the spirit and scope of the invention.

What is claimed is:

1. An overvoltage protection circuit comprising:

first and second regions, formed within a substrate having a first conductivity type, said first and second regions having a second conductivity type and having the same area;

third and fourth regions, having the first conductivity type, formed within said first and second regions, respectively, wherein said third and fourth regions are not continuous, having sub-areas contained within them through which portions of said first and second regions, respectively, are exposed,;

a fifth region, formed within the substrate, having the second conductivity type and having an area approximately twice that of said first region;

a sixth region, having the first conductivity type, formed within said fifth region, wherein said sixth region is also not continuous, also having sub-areas contained within it through which portions of said fifth region is exposed, and wherein a hole density of the sub-areas in said sixth region is no more than one-third a respective hole density of the sub-regions within the third and fourth regions;

first, second and third conductive contacts connected to said first, second, and fifth regions, respectively, said first contact also contacting said third region, said second contact also contacting said fourth region, and said third contact also contacting said sixth region, wherein bilateral switches are formed between each pair of said conductive contacts;

first and second sensors electrically connected to said first and second contacts for sensing current flow through signal lines connected to said first and second contacts; and first and second circuits, connected to said sensors, for electrically connecting the first and second contacts together when the sensed current flow surpasses a selected level.

2. The overvoltage protection circuit of claim 1, said first and second sensors comprise resistors.

3. The overvoltage protection circuit of claim 2, wherein said first and second circuits comprise thyristors.

4. The overvoltage protection circuit of claim 1, wherein said sensors and circuits operate for current flowing in a first direction, and further comprising:

third and fourth sensors electrically connected to said first and second contacts for sensing current flow through the signal lines in a second direction; and third and fourth circuits, connected to said third and fourth sensors, for electrically connecting the first and second contacts together when the sensed current flow in the second direction surpasses the selected level.

5. The overvoltage protection circuit of claim 1 or claim 4, wherein said sensors and said circuits are formed within said first and second regions, thereby forming a monolithic integrated circuit.

* * * * *